United States Patent
Yokoyama et al.

[19]

[11] Patent Number: 5,865,961
[45] Date of Patent: Feb. 2, 1999

[54] MAGNETRON SPUTTERING APPARATUS AND METHOD

[75] Inventors: Masahide Yokoyama, Hirakata; Hiroshi Hayata, Katano; Seiichiro Mori, Neyagawa; Toshiyuki Suemitsu, Mino; Eiji Ohno, Hirakata, all of Japan

[73] Assignee: Matsushita Electric Industrial Co., Ltd., Kadoma, Japan

[21] Appl. No.: 578,030

[22] Filed: Dec. 26, 1995

[30] Foreign Application Priority Data

Dec. 26, 1994 [JP] Japan ................................ 6-322033

[51] Int. Cl.⁶ .................................................. C23C 14/35
[52] U.S. Cl. ................... 204/192.12; 204/298.16; 204/298.17; 204/298.19; 204/298.2; 204/298.12
[58] Field of Search .......................... 204/192.12, 192.13, 204/298.03, 298.16, 298.17, 298.18, 298.19, 298.2, 298.22, 298.12

[56] References Cited

U.S. PATENT DOCUMENTS

| | | | |
|---|---|---|---|
| 4,515,675 | 5/1985 | Kieser et al. | 204/298.19 |
| 4,761,218 | 8/1988 | Boys | 204/298.19 |
| 4,865,712 | 9/1989 | Mintz | 204/192.12 |
| 5,106,470 | 4/1992 | Takei et al. | 204/298.2 |

*Primary Examiner*—M. Nuzzolillo
*Assistant Examiner*—Rodney G. McDonald
*Attorney, Agent, or Firm*—Wenderoth, Lind & Ponack, L.L.P.

[57] ABSTRACT

A magnetron sputtering apparatus has a plurality of ring-shaped flat targets with different diameters disposed about one center axis. The apparatus includes magnets having the same polarity as each other and placed on both front surface side and rear surface side of each of the targets along an inner circumferential edge thereof, and magnets having the same polarity as each other and placed on both front surface side and rear surface side of each of the targets along an outer circumferential edge thereof. The magnets placed along the inner and outer circumferential edges are placed in such a way that the magnets along the inner circumferential edge and the magnets along the outer circumferential edge become opposite in polarity to each other.

13 Claims, 9 Drawing Sheets

MAGNETRON SPUTTERING APPARATUS AND METHOD

BACKGROUND OF THE INVENTION

The present invention relates to a magnetron sputtering apparatus and a magnetron sputtering method in which a plurality of ring-shaped flat targets with different diameters are disposed about the same center axis.

A magnetron sputtering technique has been used as a technique for depositing a thin film on a substrate. The magnetron sputtering technique, which enables low-temperature fast sputtering, has become the mainstream of film forming apparatus using the sputtering technique. In the magnetron sputtering technique, plasma is generated around the target through discharge or the like, the resulting plasma ions are thrown into collisions with the target, whereby particles are sputtered, and the sputtered particles are deposited onto the substrate. Thus, a thin film is fabricated.

Figure 8:
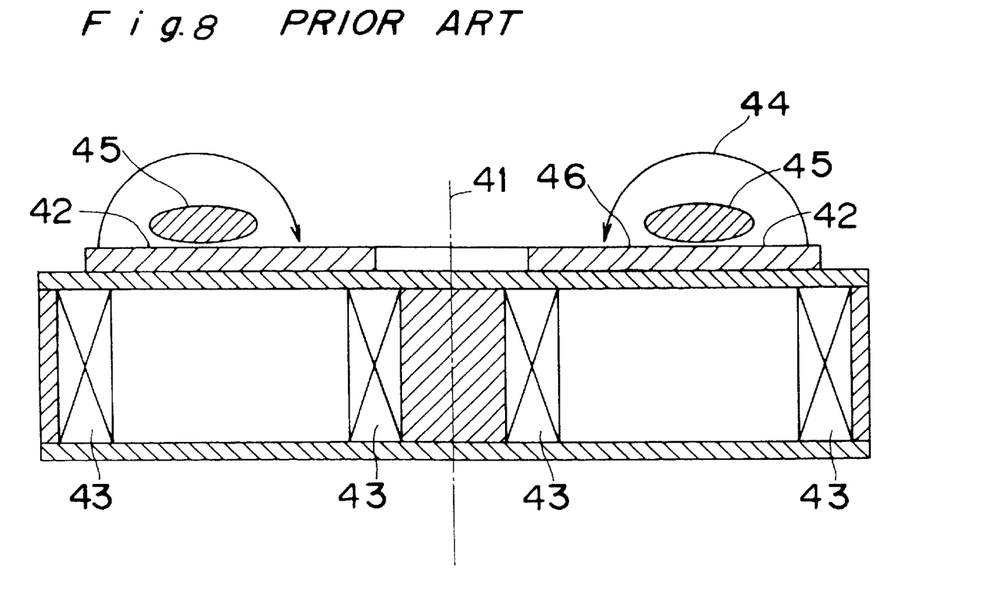
FIG. 8 is a sectional view of a cathode part of a magnetron sputtering apparatus which in a prior art example.

A magnetron sputtering apparatus of a prior art example is described with reference to FIGS. 8 to 10. FIG. 8 shows the construction of the cathode part of a conventionally used magnetron sputtering apparatus using ring-shaped flat targets. Designated by reference numeral 41 is a center axis, and the cathode part is rotationally symmetrical with respect to the center axis. Numeral 42 denotes a ring-shaped flat target, 43 denotes a magnet placed on the rear side of the targets, and 44 denotes a magnetic field formed by the magnets 43.

The cathode part of such a construction is so arranged that the substrate and the target surface are opposed to each other within a vacuum treatment chamber. After the introduction of sputter gas, the target 42 is fed with power from a high-voltage power supply for glow discharge. Then, a sputtering-use high-density plasma confined by lines of magnetic force is generated. Ions within the plasma colliding with the surface of the target 42, atoms of the target 42 are sputtered so as to be deposited onto the opposing surface of the substrate. Thus, a thin film is formed. The plasma in this process is higher in density at a region 45. The target 42 is eroded by this plasma. The target 42 is eroded at a higher rate around the region 45 of high plasma density, and in particular, the target 42 is eroded at a locally higher rate in the vicinity of an end portion 46 of the region 45, an end as viewed in the direction of lines of magnetic force.

Figure 9:
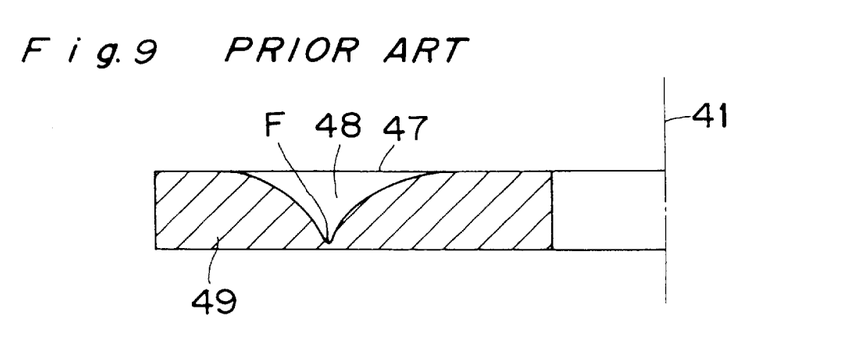
FIG. 9 is a sectional view showing an eroded surface at the target use limit in the prior art example.

FIG. 9 shows an erosion configuration when the target 42 is exploited up to its use limit by a cross section including the center axis 41. The symmetrical part with respect to the center axis 41 is omitted. Referring to FIG. 9, reference numeral 47 denotes the configuration of the target 42 before sputtering, 48 denotes the sputtered region, and 49 denotes the region remaining unsputtered. As seen in FIG. 9, the vicinity of point F is intensely eroded, causing a V-shaped eroded surface. With the occurrence of an erosion of such a shape, the volumetric use efficiency of the target 42, or the ratio of the sputtered volume to the unsputtered volume of the target when the target is exploited to its use limit, would be about 20%. What is more, only about 10% of the 20% volume would lend itself to deposition onto the substrate. This causes an issue in that the expensive target 42 is not sufficiently exploited. Further, a technical issue is that erosion of this configuration would lead to a variation with time in the film forming rate and the film thickness uniformity.

To solve these issues, there have been proposed techniques as described in Japanese Laid-Open Patent Publications Nos. 5-209266 and 5-179440. The magnetron sputtering cathode as described in Japanese Laid-Open Patent Publication No. 5-209266 is so arranged that magnets are placed on the rear side of the targets, as in the prior art example of FIG. 8, and that ferromagnetic materials are placed on outer and inner circumferences of the targets, whereby magnetic flux is extended beyond the target surface. This arrangement makes the plasma density more uniform and the target erosion also more uniform. FIG. 10 shows the result of erosion when the target is exploited to its use limit with the above arrangement. As in FIG. 9, reference numeral 47 denotes the target configuration before sputtering, 48 denotes the sputtered region, and 49 denotes the region remaining unsputtered. According to FIG. 10, it can be seen that the erosion has progressed more uniformly than in FIG. 9. However, the erosion rate is higher around point G. Further, whereas the volumetric use efficiency of the target in this case is about 40%, only about 10% of the percentage volume would be deposited onto the substrate.

By the conventional method in which the magnet 43 is placed on the rear side of the target 42, a V-shaped eroded surface is formed as shown in FIG. 9. As a result, the target 42 would become locally thinner, and the point at which the thickness of the target 42 reaches below a specified value would be the use limit for the target 42, where the target 42 could not be exploited any more. However, the target 42 still has enough material present therein to form a thin film, posing an issue in that the expensive target 42 cannot be sufficiently exploited. Further, an erosion progress with a locally faster rate would cause the distribution of sputter particles to vary with time, leading to an issue in that the film thickness of the film formed on the substrate would be non-uniform at the final stage of erosion even if the film thickness at the early stage of erosion is uniform. Furthermore, to obtain film thickness uniformity, it is necessary to keep a distance of 70 mm or more between the substrate and target. This would lead to yet another issue that only about 10% of particles sputtered from the target would be deposited onto the substrate.

Figure 10:
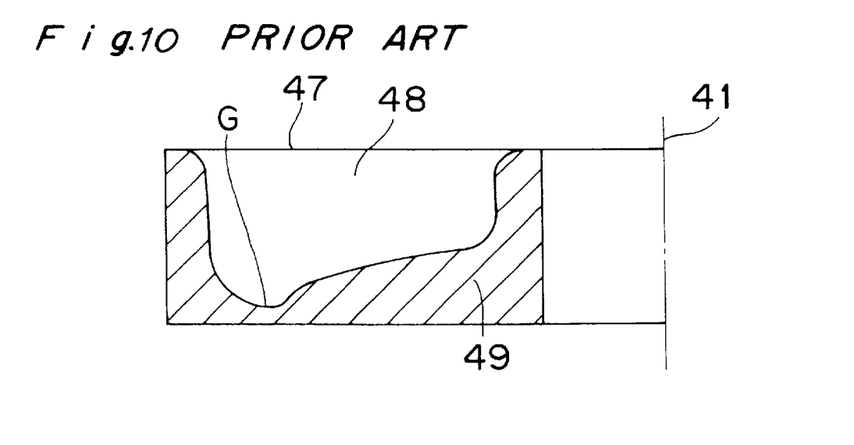
FIG. 10 is a sectional view showing an eroded surface at the target use limit in another prior art example.

Also, even in the technique as described in Japanese Laid-Open Patent Publication No. 5-209266, a local erosion would occur around G point as shown in FIG. 10. This accounts for an issue is that the target use efficiency is so low, and the probability of deposition of particles onto the substrate is so low, that variations with time in the film thickness uniformity, film forming rate, and the like would result.

Figure 11:
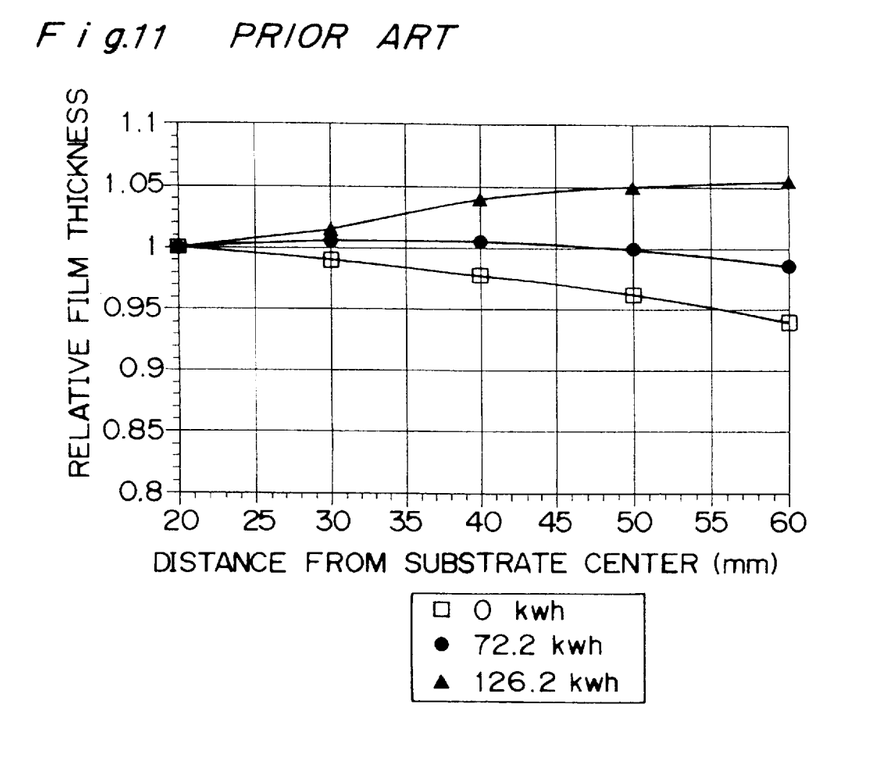
FIG. 11 is a chart showing a variation with time in the film thickness distribution on the substrate in the prior art example.

The variation with time in the film thickness in the prior art example is now explained with reference to FIG. 11. FIG. 11 is a chart showing variations with time in the thickness distribution of a thin film formed on a substrate with inner diameter 40 mm and outer diameter 120 mm, by the medium of integrating watts. The vertical axis represents the relative film thickness with the film thickness of the inner circumferential edge of the substrate assumed to be 1, while the horizontal axis represents the distance from the center point. As seen in this chart, the prior art example has an issue is that the distribution of film thickness would undergo a considerable variation with time.

SUMMARY OF THE INVENTION

In view of the above-described issues of the prior art, an object of the present invention is to provide a magnetron sputtering apparatus and a magnetron sputtering method each of which is free from the generation of local erosion.

In accomplishing these and other objects, according to one aspect of the present invention, there is provided a magnetron sputtering apparatus having a plurality of ring-shaped flat targets with different diameters disposed about one center axis. The apparatus comprising magnets having the same polarity as each other and placed on both a front surface side and a rear surface side of each of the targets along an inner circumferential edge thereof. Magnets having the same polarity as each other, further, are placed on both front surface side and rear surface side of each of the targets along an outer circumferential edge thereof. The magnets placed along the inner and outer circumferential edges are placed in such a way that the magnets along the inner circumferential edge and the magnets along the outer circumferential edge become opposite in polarity to each other.

According to another aspect of the present invention, there is provided a magnetron sputtering method in which a plasma is generated in a vicinity of ring-shaped flat targets arranged facing a substrate in a vacuum chamber to form a thin film, on the substrate. Magnets, having the same polarity as each other, are placed on both a front surface side and a rear surface side of each of the targets along an inner circumferential edge thereof. Magnets, having the same polarity as each other, are placed on both the front surface side and the rear surface side of each of the targets along an outer circumferential edge thereof, furthermore. The magnets placed along the inner and outer circumferential edges are placed in such a way that the magnets along the inner circumferential edge and the magnets along the outer circumferential edge become opposite in polarity to each other;

supplying electric powers to the targets. Generating magnetic fields are formed approximately parallel to front surfaces of the targets and have approximately uniform intensities, due the magnets along the inner and outer peripheral edges to distribute the plasma in approximately uniform conditions.

The thin film is then formed on the substrate.

BRIEF DESCRIPTION OF THE DRAWINGS

These and other aspects and features of the present invention will become clear from the following description taken in conjunction with the preferred embodiments thereof and with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

Hereinbelow, magnetron sputtering apparatuses and methods according to embodiments of the present invention are described with reference to FIGS. 1A through 7.

Figure 1A:
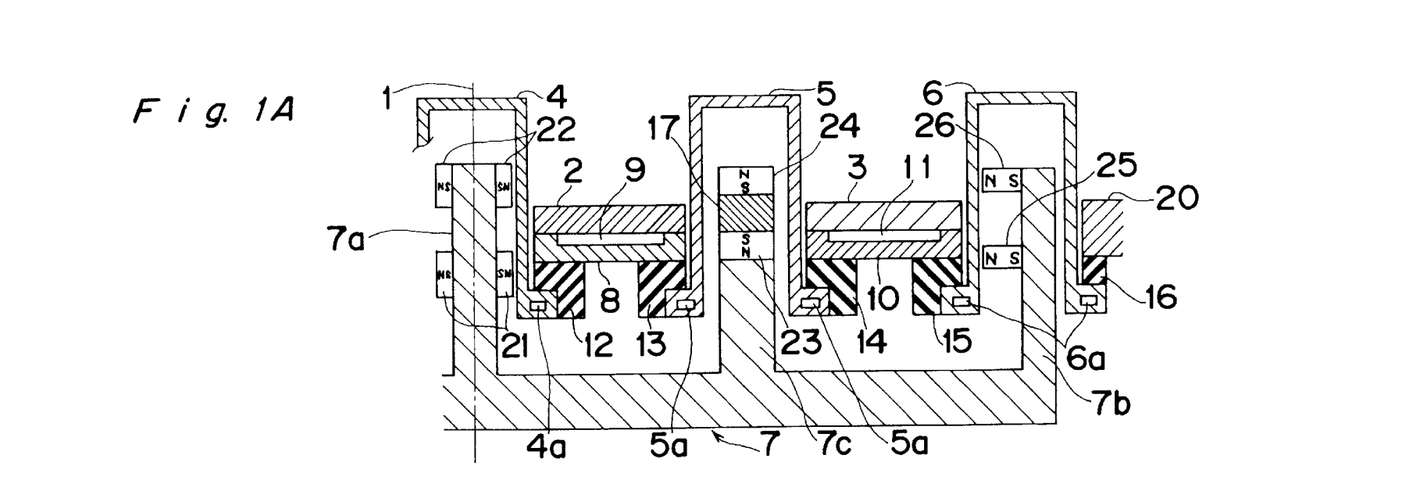
FIG. 1A is a sectional view of a cathode part of a magnetron sputtering apparatus according to a first embodiment of the present invention.
Figure 1B:
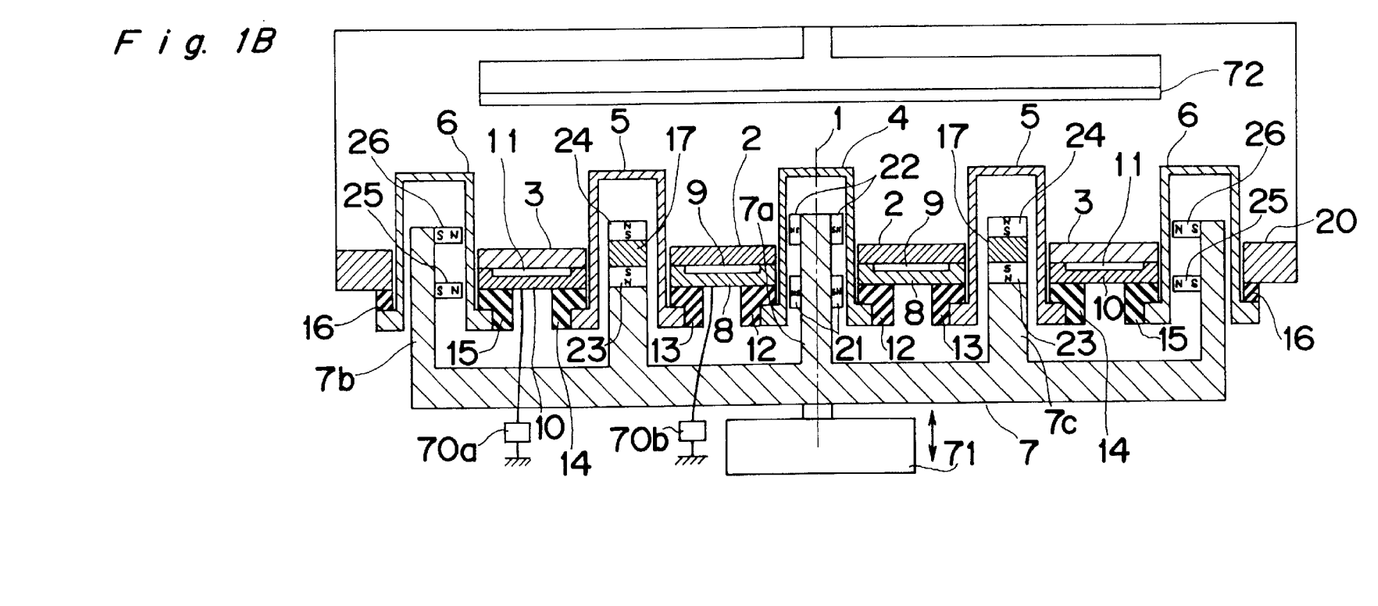
FIG. 1B is a sectional view of the whole of the magnetron sputtering apparatus according to the first embodiment of the present invention with cooling water paths omitted.
Figure 1C:
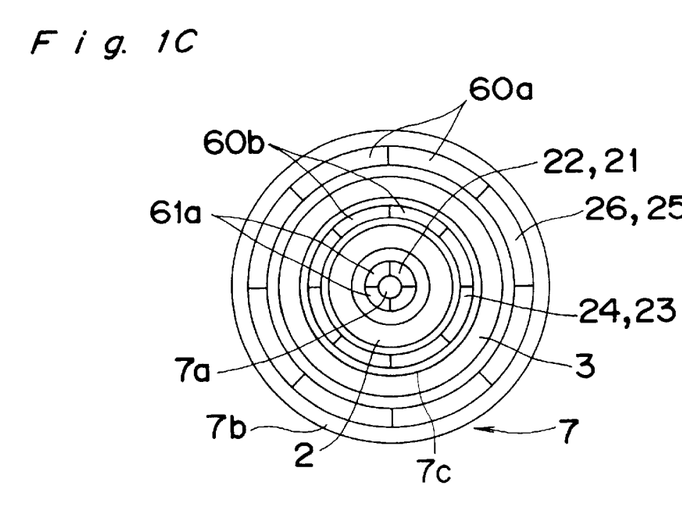
FIG. 1C is a plan view of the cathode part of the magnetron sputtering apparatus according to the first embodiment of the present invention.

A first embodiment in FIGS. 1A, 1B, 1C presents an example of a magnetron sputtering apparatus using two ring-shaped flat targets, one with a inner diameter of 36 mm, an outer diameter of 64 mm, and a thickness of 6 mm, and the other with an inner diameter 110 mm, an outer diameter 142 mm, and a thickness 6 mm.

FIGS. 1A and 1B show sectional views of a cathode part and the whole of the magnetron sputtering apparatus of the present embodiment. The cathode part is rotationally symmetrical with respect to a center axis 1, wherein a small-diameter target 2 is placed between an inner circumferential electrode 4 and an intermediate circumferential electrode 5, and a large-diameter target 3 is placed between the intermediate circumferential electrode 5 and an outer circumferential electrode 6. Designated by numeral 7 is a yoke for supporting the cathode part, the yoke 7 being made of ferromagnetic SS41 alloy in the JIS (Japanese Industrial Standard). In the yoke 7, a side plate 7b with an inner diameter of 198 mm, a thickness of 9 mm, and a height of 84 mm is integrally provided at the periphery of a bottom plate having a thickness of 15 mm. Further, a columnar projection 7a having a diameter of 10 mm and a height of 87.5 mm is provided in the axial center, and a cylindrical projection 7c with an outer diameter of 104 mm, an inner diameter of 84 mm, and a height of 62 mm is provided in a radially intermediate position.

Rear-side members 8, 10 are provided in contact with the rear sides of the targets 2, 3. The targets 2, 3 are cooled by passing cooling water through clearances 9, 11 between the rear sides of the targets 2, 3 and the rear-side members 8, 10. In the drawings, inlets and outlets for the cooling water are omitted.

The target 2 and the rear-side member 8 are insulated from the inner circumferential electrode 4 and the intermediate circumferential electrode 5 by insulators 12, 13. The target 3 and the rear-side member 10 are insulated from the intermediate circumferential electrode 5 and the outer circumferential electrode 6 by insulators 14, 15. Further, the outer circumferential electrode 6 is insulated from a chamber 20 by an insulator 16. Negative electric potentials are supplied to the targets 2, 3 by sources 70b, 70a. The ratio of the negative electric potentials of the sources 70a, 70b is 5:1 as one example. The value of the source 70a of the ratio is preferably greater than that of the source 70b. That is, the intensity of the magnetic fields generated on the inner side of the target 2 is greater than that of the outer side of the target 3.

Inside the inner circumferential electrode 4 are placed a pair of ring-shaped permanent magnets 21, 22 having an inner diameter of 10 mm, a thickness 5 mm, and a height of 10 mm, which are made of a material with a remanent magnetic flux density of 12.1 K gausses and a coercive force of 11.6 K oersteds. One permanent magnet 21 is located on the rear surface side of the target 2 while the other permanent magnet 22 is located on the front surface side of the target 2. Both are polarized to the N pole at the outer circumferential sides.

Inside the intermediate circumferential electrode 5 are placed a pair of ring-shaped permanent magnets 23, 24 with an outer diameter of 104 mm, an inner diameter of 84 mm, and a thickness 5 mm. They are made of the same material as the magnets 21, 22 of the inner circumferential electrode 4. One permanent magnet 23 is located on the rear surface side of the targets 2, 3 while the other permanent magnet 24 is located on the front surface side of the targets 2, 3. These magnets 23, 24 have their S poles opposed to each other via a non-magnetic material 17.

Inside the outer circumferential electrode 6 are placed a pair of ring-shaped permanent magnets 25, 26 with an inner diameter of 176 mm, a thickness 9 mm, and a height of 5 mm. They are made of the same material as the permanent magnets 21, 22 of the inner circumferential electrode 4. One permanent magnet 25 is located on the rear surface side of the target 3 while the other permanent magnet 26 is located on the front surface side of the target 3. Both are polarized to the N pole at the inner circumferential side.

Figure 2:
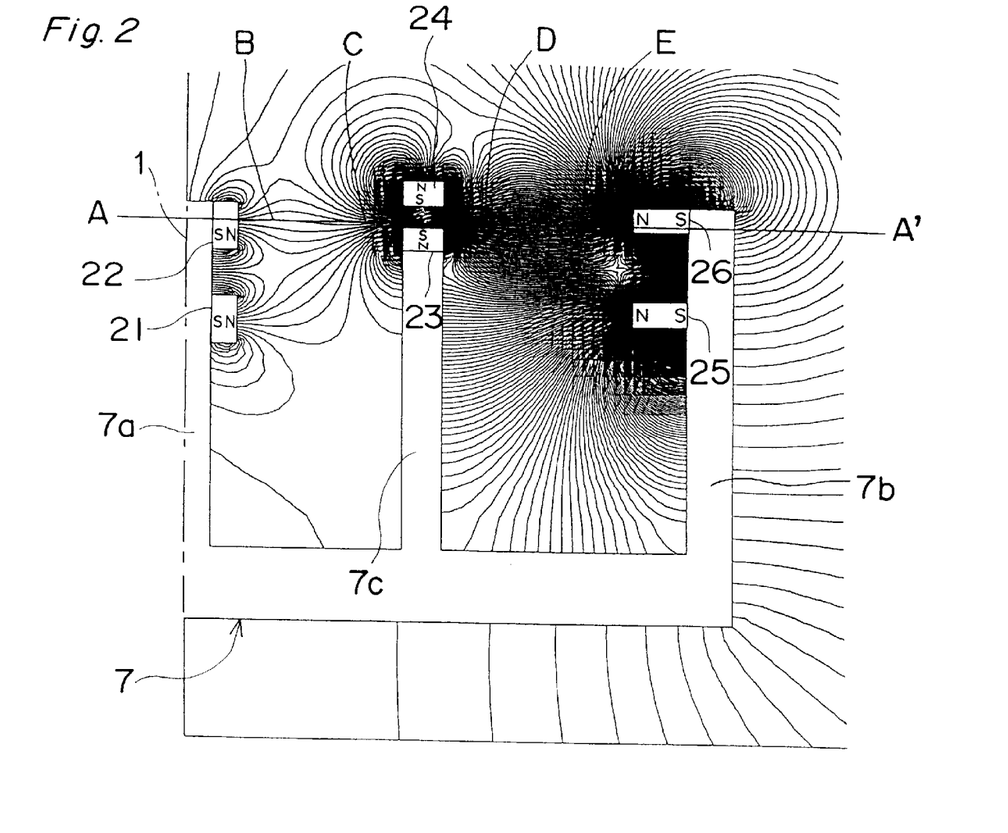
FIG. 2 is a view showing a state of magnetic fields in the first embodiment.

Now that the permanent magnets 21 to 26 have been selected for their intensity, ring shape, distance from magnet to magnet, and shape of yoke as described above, an arrangement becomes possible that in which, on the surfaces of the targets 2, 3 there exist, in the radial direction, two points at which the lines of magnetic force are oriented parallel to the target surfaces. FIG. 2 depicts the lines of magnetic force in the magnet arrangement of the first embodiment of FIGS. 1A, 1B, 1C, on a plane passing the center axis 1. In the figure, the lines of magnetic force are formed symmetrically with respect to the center axis 1, and therefore one half is omitted. Referring to FIG. 2, if the targets 2, 3 are placed so that the target surfaces are located in proximity to the line A–A', then around B and C points and around D and E points there exist such points that the lines of magnetic force become parallel to the target surfaces.

Paths 4a, 5a, and 6a for the flow of cooling water are provided at the lower parts of the inner circumferential electrode 4, the intermediate circumferential electrode 5, and the outer circumferential electrode 6 to cool the electrodes 4, 5, and 6 with the water. Reference numeral 71 denotes a driving device, such as a driving cylinder, for moving the yoke 7 in FIG. 1A upward and downward so as to adjust the positions of the magnets 21, 22, 23, 24, 25, and 26 with respect to the targets 2, 3. Thus, the yoke 7 supporting the magnets along the inner and outer peripheral edges is arranged to be movable relative to the targets 2, 3 so as to adjust the position of the yoke 7 along the center axis 1 of the yoke 7 by driving the driving device 71 along the center axis 1.

The cathode part of the arrangement as described above operates in the magnetron sputtering apparatus in the following manner.

The cathode part with the above-described arrangement is installed in the vacuum treatment chamber 20 so that the target surfaces are opposed to a substrate 72 at a distance of 35 mm and their center axes become coincident with each other as shown in FIG. 1B. The substrate 72 has an inner diameter of 40 mm and an outer diameter of 120 mm as one example. After the sputter gas is introduced into the vacuum treatment chamber 20, the targets 2, 3 are fed with power from high-voltage power supplies 70a, 70b for glow discharge. Then, a sputtering-use high-density plasma confined by lines of magnetic force is generated. When ions within this plasma collide with the surfaces of the targets 2, 3, the atoms of the targets 2, 3 are sputtered and deposited onto the opposing surface of the substrate 72, whereby a thin film is formed thereon.

Figure 3:
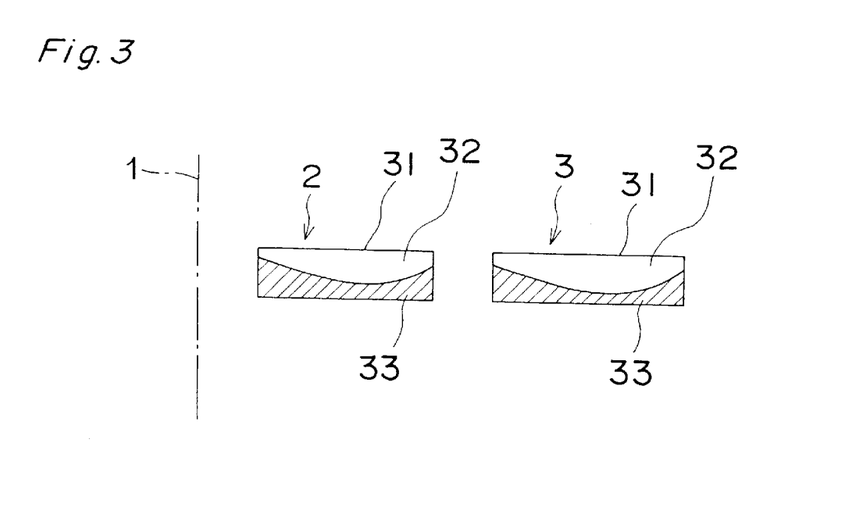
FIG. 3 is a sectional view showing eroded surfaces at target use limits in the first embodiment.

FIG. 3 depicts erosion configurations when the targets 2, 3 are utilized to their use limit, by a cross section including the center axis 1. It is noted that the portion symmetrical with respect to the center axis 1 is omitted. Reference numeral 31 denotes the configuration of the target before sputtering, 32 denotes the sputtered region, and 33 denotes the region remaining unsputtered. In this case, the volumetric use efficiency of the target is 58%, exhibiting a great improvement over the conventional 40%.

Figure 4A:
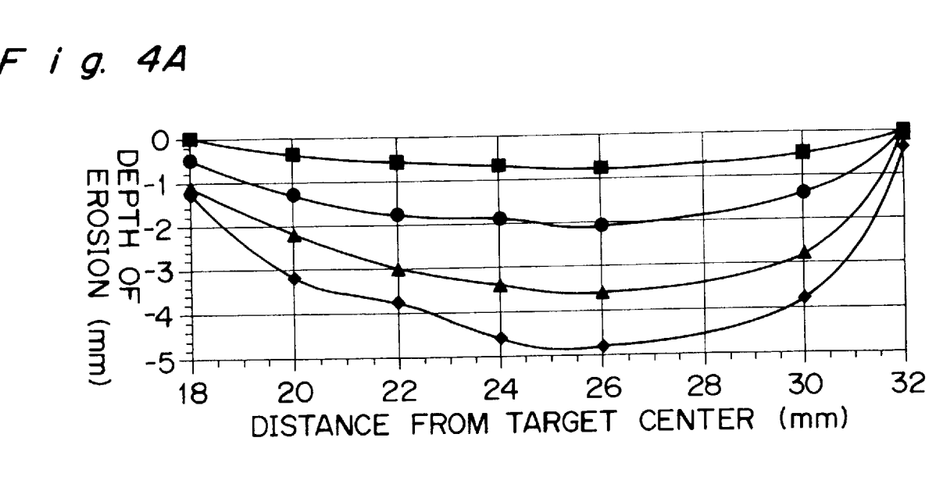
FIGS. 4A and 4B are charts showing variations with time in the eroded surfaces of the targets in the first embodiment.
Figure 4B:
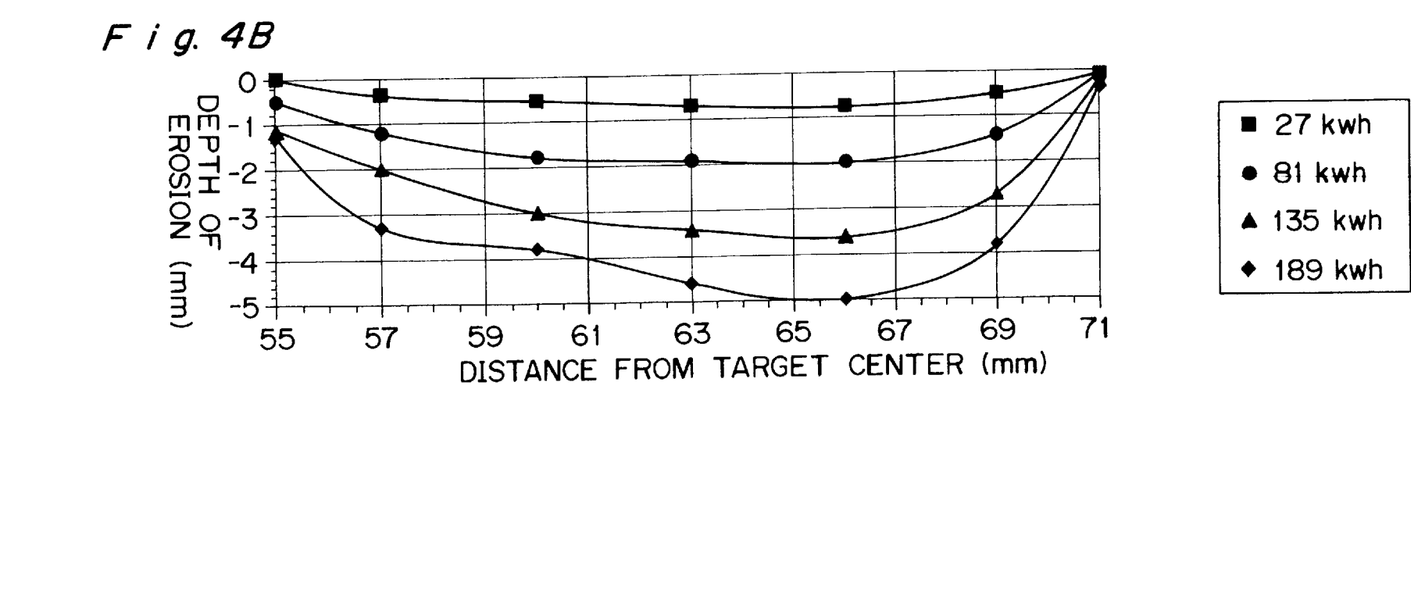

FIGS. 4A and 4B chart variations with time in the erosion configuration when the targets 2, 3 are utilized to their use limit, and more specifically, variations with integrating watts. The abscissa axis represents the distance from the center axis 1, and the ordinate axis represents the depth of erosion. Each curve shows an aspect of the eroded surface when each integrating watts is applied as shown in FIG. 4B. As seen in these charts, it can be understood that the target is eroded over its entire surface from the early stages of film formation to the target use limit, so that the erosion configuration undergoes almost no variation. Further, as seen in these charts, it is also understood that the target use efficiency also increases, because there are no places where the erosion progresses locally faster, according to the present embodiment.

Figure 5:
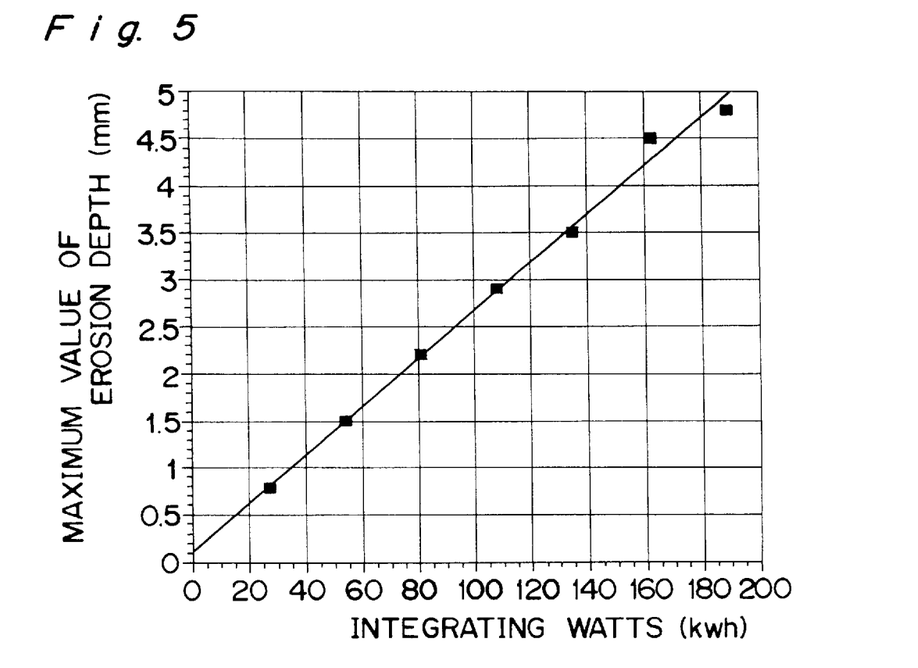
FIG. 5 is a chart showing a variation with time in the erosion depth of the target in the first embodiment.

FIG. 5 charts the relationship between the maximum value of erosion depth and the integrating watts, i.e., how the maximum value of erosion depth varies with time. As seen in this chart, it can be understood that the erosion depth is maintained almost constant and that the number of particles sputtered from the target per unit time has undergone almost no variation with time.

Figure 6:
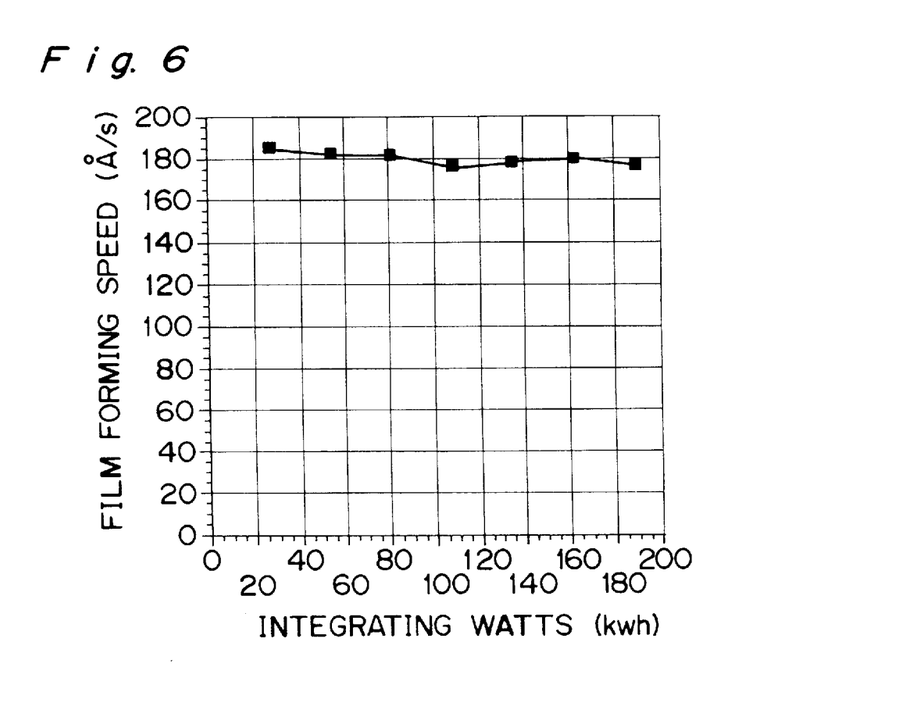
FIG. 6 is a chart showing a variation with time in the film forming speed on the substrate in the first embodiment.

FIG. 6 charts the relationship between the film forming speed and the integrating watts when the targets 2, 3 are used to their use limit, i.e., a variation with time in the film forming speed. This chart takes a view of the film forming speed at the center point of the substrate. As seen from this chart, the rate of change in the film forming speed is 5%, a great improvement over the conventional rate of change of 20%.

Figure 7:
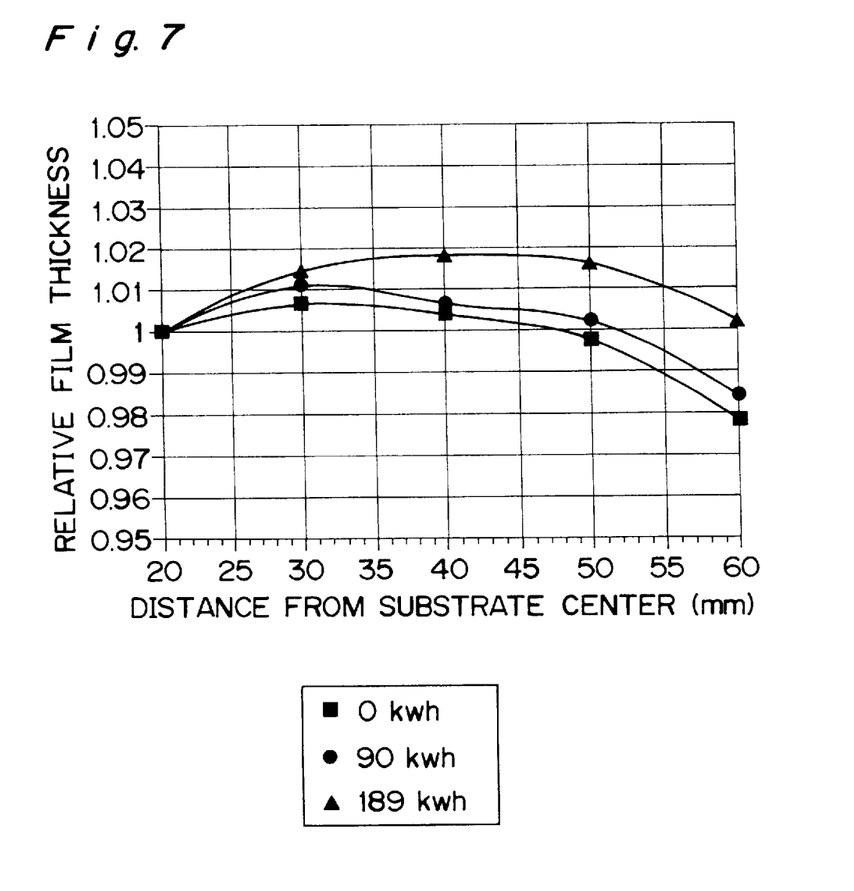
FIG. 7 is a chart showing a variation with time in the film thickness distribution on the substrate in the first embodiment.

FIG. 7 charts a variation with time in the film thickness distribution when the targets 2, 3 are utilized to their use limit, by the medium of integrating watts. The ordinate axis represents the relative film thickness with the film thickness of the inner circumferential edge of the substrate assumed to be 1. As seen from this chart, the film formation has undergone almost no variation with time over the entire substrate surface. It can also be understood that the film thickness distribution is within 2% uniformly throughout from beginning to end of use of the targets. As compared with FIG. 11, which is a chart showing the film thickness distribution of the prior art example, it can be understood that the issue of non-uniformity in the film thickness distribution involved in the erosion of the targets has been improved to a great extent, so that a stable film formation can be accomplished.

The present invention is not limited to the above first embodiment in FIGS. 1A through 1C.

Figure 1D:
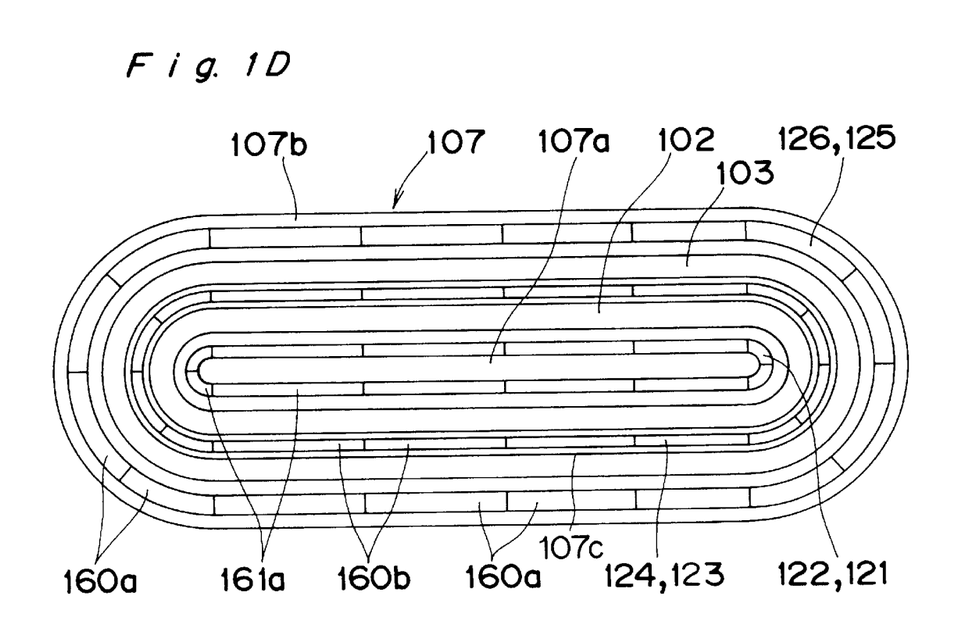
FIG. 1D is a plan view of a cathode part of a magnetron sputtering apparatus according to a second embodiment of the present invention.

For example, FIG. 1D is a plan view of a cathode part of a magnetron sputtering apparatus according to a second embodiment of the present invention. In the second embodiment, an approximately elliptic ring-shaped flat targets 102, 103 can be used instead of the ring-shaped flat target 2, 3. In the second embodiment, the targets 102 and 103 may be composed of a plurality of separated members. Magnets 126, 125, 124, 123, 122, 121 corresponding to the magnets 26, 25, 24, 23, 22, 21 in FIGS. 1A through 1C each may be composed of a plurality of separated members 160a, 160b, 161a. Reference numeral 170, 170a, 170b, 170c denote the yoke, the columnar projection thereof, side plate thereof, and the cylindrical projection thereof corresponding to 7, 7a, 7b, and 7c in FIGS. 1A and 1C, respectively.

Figure 1E:
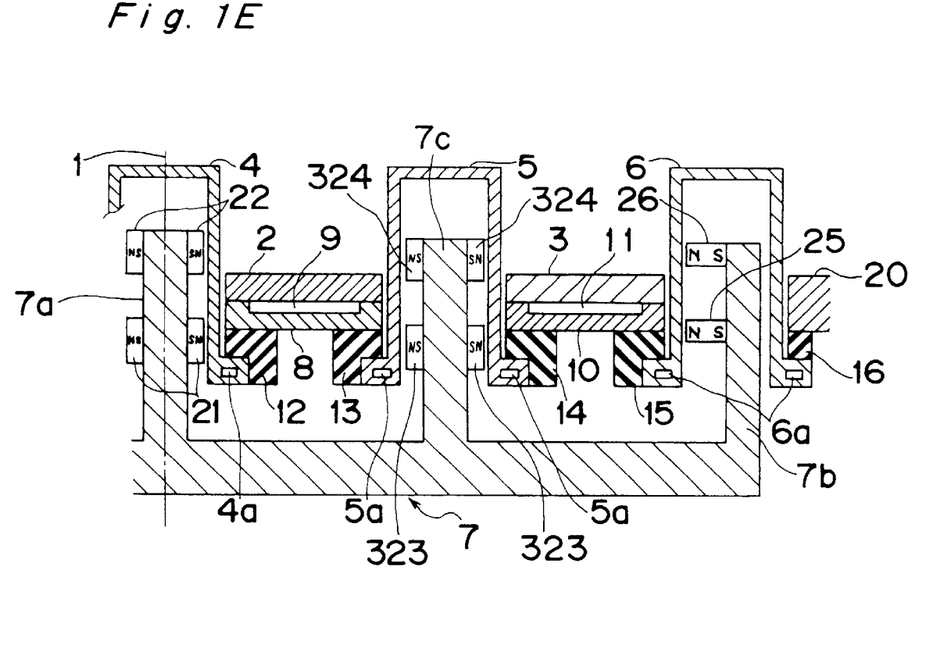
FIG. 1E is a sectional view of a cathode part of a magnetron sputtering apparatus according to a third embodiment of the present invention.

FIG. 1E is a sectional view of a cathode part of a magnetron sputtering apparatus according to a third embodiment of the present invention. In the first embodiment, the magnets placed along the outer circumferential edge of the inner side flat target 2 and the magnets placed along the inner circumferential edge of the outer flat target 3 are provided by common magnets 23, 24, and the number of magnets is reduced while the dead space for the placement of the magnets can be reduced. However, if it is necessary to reduce the number of the magnets, magnets 324, 323 are arranged at the cylindrical projection 7c in the similar to the arrangement of the magnets 22, 21 as shown in the third embodiment.

According to the present invention, a plurality of ring-shaped flat targets with different diameters are disposed about the same center axis, wherein, for each target, magnets having the same polarity are placed on both the front surface side and rear surface side of a position along an inner circumferential edge of each of the targets, and magnets having the same polarity are placed on both the front surface side and rear surface side of a position along an outer circumferential edge of the target in such a way that the magnets on the inner circumferential side and the magnets on the outer circumferential side become opposite in polarity to each other. Therefore, on the surfaces of the plurality of ring-shaped targets arrayed radially in parallel, there can be formed magnetic fields generally parallel to the target surfaces and generally uniform in intensity. FIG. 2 shows results of verifying the lines of magnetic force around target cross sections by a computer simulation in an example of the first embodiment of the present invention. As shown in FIG. 2, at the surface of each target, a magnetic field generally parallel to the target surface is formed, showing no significant variations in the intensity of magnetic field, i.e., in the intervals between lines of magnetic force.

Since magnetic fields are formed in parallel to the target surfaces over the entire target surfaces as shown above, the erosion of the targets makes uniform progress. In other words, whereas the erosion speed of targets depends on the plasma density, the magnetic fields formed in parallel to the target surfaces allow a uniform distribution of plasma density to be obtained, so that the erosion is carried out uniformly. Also, the magnetron sputtering features the particles being rotated by an electromagnetic force due to the outer product of the velocity vector of ions and the magnetic-field vector, so that the particles will collide with the target at increased opportunities. Accordingly, the opportunity that ions collide with the target depends on the rotation cycle of the ions, where the shorter the rotation cycle, i.e., the more intense the magnetic fields and the higher the velocity at which the ions take motion, the more the opportunity that the ions collide with the target increases. Generally, electric fields are formed vertically to the target surface. Therefore, with magnetic fields formed in parallel to the target surface, the magnetic fields and the electric fields that cause the ions to be put into motion become vertical to each other, so that the outer product of the velocity vector of ions and the magnetic-field vector becomes maximum and uniform. As a result, the rotation cycle of ions becomes short and uniform, so that the erosion of the target is carried out efficiently and uniformly.

By the erosion of the target being carried out uniformly are above, the thin film formed on the substrate becomes uniform in film thickness while its variation with time can be reduced. More specifically, since the particles are sputtered in a direction that depends on the orientation of the target surface, the film thickness of the thin film formed on the substrate surface would vary with time if the angle formed by the target surface and the substrate surface vary with time. In the early stage of erosion, the target is flat and positioned in parallel to the substrate surface, and therefore the film thickness of the thin film formed on the substrate surface is approximately constant. However, as the target surface becomes a curved surface with the progress of erosion, the film thickness of the thin film formed on the substrate surface becomes non-uniform. Therefore, even if the erosion progresses as described above, the eroded surface is maintained as a nearly flat surface parallel to the target surface before the erosion. Thus, the film thickness of the thin film formed on the substrate can be maintained uniform.

Also, if the erosion was carried out locally faster, the target could not be utilized any more once the fast eroded portion has reached below a specified film thickness. However, since the target is eroded uniformly, the target use efficiency can be enhanced, so that the running cost can be reduced.

Also, since a plurality of ring-shaped flat targets with different diameters are disposed about the same center axis, the film thickness uniformity can be maintained successful by feeding different levels of power to the individual targets even if the distance between target and the substrate is reduced. As a result, the particles sputtered from the targets can be deposited onto the substrate efficiently, while the film thickness uniformity can be ensured.

Also, if the magnets placed along the outer circumferential edge of an inner side flat target and the magnets placed along the inner circumferential edge of an outer flat target are provided by common magnets, then the number of magnets can be reduced while the dead space for the placement of the magnets can be reduced.

Further, if the intensities of the magnets are adjusted so as to present, in the radial direction, two or more points at which magnetic fields become parallel to the target surfaces, then the magnetic fields are oriented more parallel to the target surfaces so that the effect can be further enhanced.

According to the magnetron sputtering apparatus of the present invention, and as apparent from the foregoing description, a plurality of ring-shaped flat targets with different diameters are disposed about the same center axis, and the magnets are arranged in such a specified manner that on the surfaces of the targets there can be formed magnetic fields generally parallel to the target surfaces and generally uniform in intensity. Therefore, the plasma density on the individual targets becomes uniform, and the rotation cycle of ions becomes also uniform. As a result, even if the targets are utilized to their use limit, a stable uniform thin film can be fabricated on the substrate. Further, the use efficiency of expensive targets can be enhanced, while the running cost can be reduced.

Also, if the magnets placed along the outer circumferential edge of an inner side flat target and the magnets placed along the inner circumferential edge of an outer flat target are provided by common magnets, then the number of magnets can be reduced while the dead space for the placement of the magnets can be reduced.

Further, if the intensities of the magnets are adjusted so as to present, in the radial direction, two or more points at which magnetic fields become parallel to the target surfaces, then the magnetic fields are oriented more parallel to the target surfaces so that the effect can be further enhanced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An arrangement in a magnetron sputtering device, comprising:

a plurality of annular flat targets each having a different diameter disposed about a common center axis, each of said targets having a front surface, a rear surface, an inner circumferential edge and an outer circumferential edge, and said plurality of annular flat targets having a front surface side and a rear surface side; and a plurality of magnets disposed relative to said plurality of flat targets, said plurality of magnets including magnets that have the same polarity and are located on both said front surface side and said rear surface side of each of said targets along said inner circumferential edges of said targets, and magnets that have the same polarity and are located on both said front surface side and said rear surface side of each of said targets along said outer circumferential edges of said targets;

wherein said plurality of magnets are located along said inner and outer circumferential edges such that said magnets located along said inner circumferential edge and said magnets located along said outer circumferential edge are opposite in polarity;

wherein said magnets located along said inner circumferential edges of said targets and having the same polarity are located concentrically with respect to said center axis of said targets, and said magnets located along said outer circumferential edges of said targets and having the same polarity are located concentrically with respect to said center axis; and wherein said plurality of magnets have intensities such that there are at least two points at which magnetic fields are oriented parallel to said surfaces of said targets with respect to a radial direction of said targets.

2. An arrangement in a magnetron sputtering device, comprising:

a plurality of annular flat targets each having a different diameter disposed about a common center axis, each of said targets having a front surface, a rear surface, an inner circumferential edge and an outer circumferential edge, and said plurality of annular flat targets having a front surface side and a rear surface side; and a plurality of magnets disposed relative to said plurality of flat targets, said plurality of magnets including magnets that have the same polarity and are located on both said front surface side and said rear surface side of each of said targets along said inner circumferential edges of said targets, and magnets that have the same polarity and are located on both said front surface side and said rear surface side of each of said targets along said outer circumferential edges of said targets;

wherein said magnets located along said inner circumferential edges of said targets and having the same polarity are located concentrically with respect to said center axis of said targets, and said magnets located along said outer circumferential edges of said targets and having the same polarity are located concentrically with respect to said center axis;

wherein said plurality of magnets have intensities such that there are at least two points at which magnetic fields are oriented parallel to said surfaces of said targets with respect to a radial direction of said targets; and wherein magnets of said plurality of said magnets that are located along said outer circumferential edge of an inner one of said plurality of annular flat targets and magnets of said plurality of magnets that are located along said inner circumferential edge of an outer one of said plurality of annular flat targets adjacent to said inner one are provided by common magnets.

3. The arrangement of claim 2, wherein said plurality of annular flat targets have the intensity of the magnetic fields generated on their inner side greater than that generated on their outer side.

4. The arrangement of claim 1, wherein said plurality of annular flat targets have the intensity of the magnetic fields generated on their inner side greater than that generated on their outer side.

5. A method of magnetron sputtering, comprising the steps of:

generating plasma in a vicinity of a plurality of annular flat targets each having a front surface, a rear surface, an inner circumferential edge and an outer circumferential edge, and the plurality of annular flat targets having a front surface side and a rear surface side, with a plurality of magnets disposed relative to the plurality of flat targets, the plurality of magnets including magnets that have the same polarity and are located on both the front surface side and the rear surface side of each of the targets along the inner circumferential edges of the targets and magnets that have the same polarity and are located on both the front surface side and the rear surface side of each of the targets along the outer circumferential edges of the targets, wherein the plurality of magnets are located along the inner and outer circumferential edges such that the magnets located along the inner circumferential edge and the magnets located along the outer circumferential edge are opposite in polarity, wherein the magnets located along the inner circumferential edges of the targets and having the same polarity are located concentrically with respect to a center axis of the targets, and the magnets located along the outer circumferential edges of the targets and having the same polarity are located concentrically with respect to the center axis;

supplying electric power to the targets;

generating magnetic fields that form approximately parallel to the front surfaces of the targets and that have approximately uniform intensities with the magnets that are located along the inner and outer circumferential edges of the targets so as to distribute the plasma approximately uniformly;

adjusting the intensities of the plurality of magnets such that there are at least two points at which magnetic fields are oriented parallel to the surfaces of the targets with respect to a radial direction of the targets; and forming a thin film on a substrate by electrically attracting atoms sputtered from the targets by ions of the plasma onto the substrate.

6. A method of magnetron sputtering, comprising the steps of:

generating plasma in a vicinity of a plurality of annular flat targets each having a front surface, a rear surface, an inner circumferential edge and an outer circumferential edge, and the plurality of annular flat targets having a front surface side and a rear surface side, with a plurality of magnets disposed relative to the plurality of flat targets, the plurality of magnets including magnets that have the same polarity and are located on both the front surface side and the rear surface side of each of the targets along the inner circumferential edges of the targets and magnets that have the same polarity and are located on both the front surface side and the rear surface side of each of the targets along the outer circumferential edges of the targets, wherein the magnets located along the inner circumferential edges of the targets and having the same polarity are located concentrically with respect to a center axis of the targets, and the magnets located along the outer circumferential edges of the targets and having the same polarity are located concentrically with respect to the center axis;

supplying electric power to the targets;

generating magnetic fields that form approximately parallel to the front surfaces of the targets and that have approximately uniform intensities with the magnets that are located along the inner and outer circumferential edges of the targets so as to distribute the plasma approximately uniformly;

adjusting the intensities of the plurality of magnets such that there are at least two points at which magnetic fields are oriented parallel to the surfaces of the targets with respect to a radial direction of the targets; and forming a thin film on a substrate by electrically attracting atoms sputtered from the targets by ions of the plasma onto the substrate;

wherein said step of generating plasma comprises generating plasma with magnets of the plurality of magnets that are located along the outer circumferential edge of an inner one of the plurality of annular flat targets and magnets of the plurality of magnets that are located along the inner circumferential edge of an outer one of the plurality of annular flat targets adjacent to the inner one being common magnets.

7. The method of claim 6, wherein said step of generating magnetic fields further comprises generating the magnetic fields so as to have a greater intensity on an inner side of the plurality of targets than on an outer side of the plurality of targets.

8. The method of claim 5, wherein said step of generating magnetic fields further comprises generating the magnetic fields so as to have a greater intensity on an inner side of the plurality of targets than on an outer side of the plurality of targets.

9. An arrangement in a magnetron sputtering device, comprising:

a plurality of annular flat targets each having a different diameter disposed about a common center axis, each of said targets having a front surface, a rear surface, an inner circumferential edge and an outer circumferential edge, and said plurality of annular flat targets having a front surface side and a rear surface side; and at least three sets of annular magnets, wherein each of said sets includes a front surface side annular magnet and a rear surface side annular magnet located at said front and rear surface sides of said plurality of annular flat targets, respectively, wherein one of said sets is disposed along the inner circumferential edge of one of said targets, a second of said sets is disposed between the one and a second of said targets and a third of said sets is disposed along the outer circumferential edge of the second of said targets, and wherein said front and rear surface side annular magnets of said one and said third of said sets has the same polarity facing the same way;

wherein said second of said sets of annular magnets is selected from the group consisting of a) said front and rear surface side annular magnets of said second of said sets having the same polarity facing the same way, the polarity being the same as a facing polarity of said front and rear surface side annular magnets of said one and said third of said sets, and b) said front and rear surface side annular magnets of said second of said sets having the poles thereof aligned in a direction substantially perpendicular to said surface of said targets such that the same poles of each of said front and rear surface side annular magnets of said second of said sets face each other, the same poles being opposite in polarity to a facing polarity of said front and rear surface side annular magnets of said one and said third of said sets;

wherein said at least three sets of annular magnets are concentric with said center axis; and wherein said plurality of magnets have intensities such that there are at least two points at which magnetic fields are oriented parallel to said surfaces of said targets with respect to a radial direction of said targets.

10. The arrangement of claim 9, wherein the second of said sets consists of two annular magnets, insulated from each other in and having their poles aligned in the direction substantially perpendicular to said surface of said targets.

11. The arrangement of claim 9, wherein the second of said sets comprises four annular magnets including two front side annular magnets and two rear side annular magnets, wherein one of said two front side annular magnets and one of said two rear side annular magnets face the one of said targets and a second of said two front side annular magnets and a second of said two rear side annular magnets face the second of said targets.

12. An arrangement in a magnetron sputtering device, comprising:

a plurality of annular flat targets each having a different diameter disposed about a common center axis, each of said targets having a front surface, a rear surface, an inner circumferential edge and an outer circumferential edge, and said plurality of annular flat targets having a front surface side and a rear surface side; and at least three sets of annular magnets, wherein each of said sets includes a front surface side annular magnet and a rear surface side annular magnet located at said front and rear surface sides, respectively, wherein one of said sets is disposed along the inner circumferential edge of one of said targets, a second of said sets is disposed between the one and a second of said targets and a third of said sets is disposed along the outer circumferential edge of the second of said targets, and wherein said front and rear surface side annular magnets of said first and third of said sets has the same polarity facing the same way;

wherein said second of said sets of annular magnets comprises two annular magnets that are insulated from each other and have poles aligned in a direction substantially perpendicular to said surfaces of said targets;

wherein said at least three sets of annular magnets are concentric with said center axis; and wherein said plurality of magnets have intensities such that there are at least two points at which magnetic fields are oriented parallel to said surfaces of said targets with respect to a radial direction of said targets.

13. A method of magnetron sputtering, comprising the steps of:

generating plasma in a vicinity of a plurality of annular flat targets each having a front surface, a rear surface, an inner circumferential edge and an outer circumferential edge, and the plurality of annular flat targets having a front surface side and a rear surface side, with a plurality of magnets disposed relative to the plurality of flat targets, the plurality of magnets including at least three sets of annular magnets, wherein each of the sets includes a front surface side annular magnet and a rear surface side annular magnet located at the front and rear surface sides of the plurality of targets, respectively, wherein one of the sets is disposed along the inner circumferential edge of one of the targets, a second of the sets is disposed between the one and a second of the targets and a third of the sets is disposed along the outer circumferential edge of the second of the targets, and wherein the front and rear surface side annular magnets of the first and third of the sets has the same polarity facing the same way, wherein the second of the sets of annular magnets comprises two annular magnets that are insulated from each other and have poles aligned in a direction substantially perpendicular to the surfaces of the targets, wherein the at least three sets of annular magnets are concentric with the center axis, and wherein the plurality of magnets have intensities such that there are at least two points at which magnetic fields are oriented parallel to the surfaces of the targets with respect to a radial direction of the targets;

supplying electric power to the targets;

generating magnetic fields that form approximately parallel to the front surfaces of the targets and that have approximately uniform intensities with the magnets that are located along the inner and outer circumferential edges of the targets so as to distribute the plasma approximately uniformly;

adjusting the intensities of the plurality of magnets such that there are at least two points at which magnetic fields are oriented parallel to the surfaces of the targets with respect to a radial direction of the targets; and forming a thin film on a substrate by electrically attracting atoms sputtered from the targets by ions of the plasma onto the substrate.

* * * * *